United States Patent
McHugh et al.

(10) Patent No.: US 7,390,383 B2
(45) Date of Patent: *Jun. 24, 2008

(54) PADDLES AND ENCLOSURES FOR ENHANCING MASS TRANSFER DURING PROCESSING OF MICROFEATURE WORKPIECES

(75) Inventors: Paul R. McHugh, Kalispell, MT (US); Gregory J. Wilson, Kalispell, MT (US); Daniel J. Woodruff, Kalispell, MT (US); Nolan Zimmerman, Kalispell, MT (US); James J. Erickson, Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 442 days.

This patent is subject to a terminal disclaimer.

(21) Appl. No.: 10/734,098

(22) Filed: Dec. 11, 2003

(65) Prior Publication Data

US 2005/0006241 A1 Jan. 13, 2005

Related U.S. Application Data

(60) Provisional application No. 60/484,603, filed on Jul. 1, 2003, provisional application No. 60/484,604, filed on Jul. 1, 2003.

(51) Int. Cl.
*C25D 17/00* (2006.01)
*C25D 17/02* (2006.01)
*C25F 7/00* (2006.01)
*C25D 7/12* (2006.01)
*C25F 3/30* (2006.01)

(52) U.S. Cl. ...................................... 204/273

(58) Field of Classification Search ................. None
See application file for complete search history.

(56) References Cited

U.S. PATENT DOCUMENTS

| 3,652,442 A | 3/1972 | Powers et al. |
| 4,428,814 A | 1/1984 | Chen |

(Continued)

FOREIGN PATENT DOCUMENTS

EP 0 343 502 A2 11/1989

(Continued)

OTHER PUBLICATIONS

U.S. Appl. No. 60/476,786, Davis et al.

(Continued)

*Primary Examiner*—Harry D Wilkins, III
(74) *Attorney, Agent, or Firm*—Perkins Coie LLP (57) ABSTRACT

Paddles and enclosures for processing microfeature workpieces are disclosed. A paddle device having multiple paddles is positioned in an enclosure to reciprocate back and forth along a generally linear path. The clearances between the paddles, the workpiece and the walls of the chamber are relatively small to increase the flow agitation at the surface of the workpiece and enhance the mass transfer process occurring there. The paddles are shaped to reduce or eliminate electrical shadowing effects created at the surface of the workpiece during electrochemical processing. Paddles on the same paddle device may have different shapes to reduce the likelihood for creating three-dimensional effects in the flow field proximate to the surface of the workpiece. The reciprocation stroke of the paddles may shift to further reduce shadowing.

39 Claims, 10 Drawing Sheets

U.S. PATENT DOCUMENTS

| | | | |
|---|---|---|---|
| 4,466,864 A | 8/1984 | Bacon | |
| 4,648,774 A | 3/1987 | Dorumsgaard et al. | |
| 4,749,601 A | 6/1988 | Hillinger | |
| 4,868,575 A | 9/1989 | Mok et al. | |
| 4,937,998 A | 7/1990 | Goldberg | |
| 5,000,827 A | 3/1991 | Schuster | |
| 5,222,310 A | 6/1993 | Thompson et al. | |
| 5,230,743 A | 7/1993 | Thompson et al. | |
| 5,284,554 A | 2/1994 | Datta et al. | |
| 5,312,532 A | 5/1994 | Andricacos et al. | |
| 5,344,491 A | 9/1994 | Katou | |
| 5,344,539 A | 9/1994 | Shinogi et al. | |
| 5,421,987 A | 6/1995 | Tzanavaras et al. | |
| 5,431,421 A | 7/1995 | Thompson et al. | |
| 5,476,577 A | 12/1995 | May et al. | |
| 5,486,282 A | 1/1996 | Datta et al. | |
| 5,516,412 A | 5/1996 | Andricacos et al. | |
| 5,531,874 A | 7/1996 | Brophy | |
| 5,536,388 A | 7/1996 | Dinan et al. | |
| 5,543,032 A | 8/1996 | Datta et al. | |
| 5,567,300 A | 10/1996 | Datta et al. | |
| 5,614,076 A | 3/1997 | Brophy | |
| 5,635,157 A | 6/1997 | Mease et al. | |
| 5,683,564 A | 11/1997 | Reynolds | |
| 5,762,751 A | 6/1998 | Bleck | |
| 5,865,984 A | 2/1999 | Corbin, Jr. et al. | |
| 5,925,226 A | 7/1999 | Hurwitt et al. | |
| 6,001,235 A | 12/1999 | Arken et al. | |
| 6,004,440 A | 12/1999 | Hanson | |
| 6,024,856 A | 2/2000 | Haydu et al. | |
| 6,027,631 A * | 2/2000 | Broadbent | 205/137 |
| 6,037,790 A | 3/2000 | Dinan | |
| 6,042,712 A | 3/2000 | Mathieu | |
| 6,048,154 A | 4/2000 | Wytman | |
| 6,082,948 A | 7/2000 | Fishkin et al. | |
| 6,103,096 A | 8/2000 | Datta et al. | |
| 6,132,586 A | 10/2000 | Adams et al. | |
| 6,136,163 A | 10/2000 | Cheung et al. | |
| 6,168,695 B1 | 1/2001 | Woodruff | |
| 6,181,057 B1 | 1/2001 | Inoue et al. | |
| 6,197,182 B1 | 3/2001 | Kaufman et al. | |
| 6,214,193 B1 | 4/2001 | Reid | |
| 6,228,231 B1 | 5/2001 | Uzoh | |
| 6,231,743 B1 | 5/2001 | Etherington | |
| 6,251,250 B1 | 6/2001 | Keigler | |
| 6,322,674 B1 | 11/2001 | Berner | |
| 6,328,872 B1 | 12/2001 | Talieh | |
| 6,379,511 B1 | 4/2002 | Fatula et al. | |
| 6,454,918 B1 | 9/2002 | Sakaki | |
| 6,482,300 B2 | 11/2002 | Sakaki | |
| 6,547,937 B1 | 4/2003 | Oberlitner et al. | |
| 6,635,157 B2 | 10/2003 | Dordi et al. | |
| 6,660,137 B2 | 12/2003 | Wilson et al. | |
| 6,672,820 B1 | 1/2004 | Hanson et al. | |
| 6,773,559 B2 | 8/2004 | Woodruff et al. | |
| 6,875,333 B2 | 4/2005 | Sakaki et al. | |
| 6,955,747 B2 * | 10/2005 | Browne et al. | 204/273 |
| 2001/0032788 A1 | 10/2001 | Woodruff et al. | |
| 2001/0052465 A1 | 12/2001 | Dordi et al. | |
| 2002/0000380 A1 | 1/2002 | Graham et al. | |
| 2002/0088708 A1 | 7/2002 | Sakaki | |
| 2003/0038035 A1 | 2/2003 | Wilson et al. | |
| 2003/0221953 A1 | 12/2003 | Oberlitner | |
| 2004/0007467 A1 | 1/2004 | McHugh et al. | |
| 2004/0134774 A1 | 7/2004 | Woodruff et al. | |
| 2004/0245094 A1 | 12/2004 | McHugh et al. | |
| 2005/0000817 A1 | 1/2005 | McHugh et al. | |
| 2005/0006241 A1 | 1/2005 | McHugh et al. | |
| 2005/0034977 A1 | 2/2005 | Hanson et al. | |
| 2005/0145499 A1 | 7/2005 | Kovarsky et al. | |
| 2005/0167275 A1 * | 8/2005 | Keigler et al. | 205/96 |

FOREIGN PATENT DOCUMENTS

| | | |
|---|---|---|
| EP | 0 726 698 A2 | 8/1996 |
| JP | 62-297494 | 12/1987 |
| JP | 62-297495 | 12/1987 |
| JP | 1-120827 | 5/1989 |
| JP | 5-175158 | 7/1993 |
| JP | 6-260468 | 9/1994 |
| JP | 7-211724 | 8/1995 |
| JP | 7-284738 | 10/1995 |
| JP | 09-089067 | 3/1997 |
| JP | 10-172974 | 6/1998 |
| JP | 11-092993 | 4/1999 |
| JP | 2000-17480 | 1/2000 |
| JP | 2001-64795 | 3/2001 |
| WO | WO-99/25004 | 5/1999 |
| WO | WO-01/50505 A3 | 7/2001 |
| WO | WO-2004/110698 A2 | 12/2004 |
| WO | WO-2005/042804 A2 | 5/2005 |

OTHER PUBLICATIONS

U.S. Appl. No. 60/476,881, Hanson.
U.S. Appl. No. 60/484,603, Wilson et al.
U.S. Appl. No. 60/484,604, Wilson et al.
Wu, Z.L. et al., "Methods for Characterization of Mass Transfer Boundary layer in an industrial Semiconductor Wafer Plating Cell," Abs. 165, 205th Meeting, © The Electrochemical Society, Inc., 2004 (1 Page).
Tacken, R.A. et al., Applications of Magnetoelectrolysis, Journal of Applied Electrochemistry, 1995 (no month), vol. 25, pp. 1-5.

* cited by examiner

PADDLES AND ENCLOSURES FOR ENHANCING MASS TRANSFER DURING PROCESSING OF MICROFEATURE WORKPIECES

CROSS-REFERENCE TO RELATED APPLICATIONS

The present application claims priority to now abandoned U.S. Provisional Application No. 60/484,603 and U.S. Provisional Application No. 60/484,604, both filed Jul. 1, 2003 and both incorporated herein in their entireties by reference.

TECHNICAL FIELD

The present invention is directed toward paddles and enclosures for processing microfeature workpieces.

BACKGROUND

Microdevices are manufactured by depositing and working several layers of materials on a single substrate to produce a large number of individual devices. For example, layers of photoresist, conductive materials, and dielectric materials are deposited, patterned, developed, etched, planarized, and so forth to form features in and/or on a substrate. The features are arranged to form integrated circuits, micro-fluidic systems, and other structures.

Wet chemical processes are commonly used to form features on microfeature workpieces. Wet chemical processes are generally performed in wet chemical processing tools that have a plurality of individual processing chambers for cleaning, etching, electrochemically depositing materials, or performing combinations of these processes. In some cases, the processing chambers include a vessel configured to electrolytically apply material to the workpiece and/or remove material from the workpiece. The workpiece is partially immersed in a bath that includes an electrolyte in fluid communication with an electrode. When material is to be added to the workpiece, electrical potentials of opposite polarities are applied to the electrode (which functions as an anode) and the workpiece (which functions as a cathode). When material is to be removed from the workpiece, the polarities are reversed so that the electrode operates as a cathode and the workpiece operates as an anode.

During electrolytic processing, a diffusion layer develops at the surface of the workpiece in contact with the electrolytic liquid. The concentration of the material applied to or removed from the workpiece varies over the thickness of the diffusion layer. In many cases, it is desirable to reduce the thickness of the diffusion layer so as to allow an increase in the speed with which material is added to or removed from the workpiece. In other cases, it is desirable to otherwise control the material transfer at the surface of the workpiece, for example to control the composition of an alloy deposited on the surface, or to more uniformly deposit materials in surface recesses having different aspect ratios.

One approach to reducing the diffusion layer thickness is to increase the flow velocity of the electrolyte at the surface of the workpiece. For example, some vessels include paddles that translate or rotate adjacent to the workpiece to create a high speed, agitated flow at the surface of the workpiece. In one particular arrangement, the workpiece is spaced apart from an anode by a first distance along a first axis (generally normal to the surface of the workpiece) during processing. A paddle having a height of about 25% of the first distance along the first axis oscillates between the workpiece and the anode along a second axis transverse to the first axis. In other arrangements, the paddle rotates relative to the workpiece. In still further arrangements, fluid jets are directed at the workpiece to agitate the flow at the workpiece surface.

The foregoing arrangements suffer from several drawbacks. For example, it is often difficult even with one or more paddles or fluid jets, to achieve the flow velocities necessary to significantly reduce the diffusion layer thickness at the surface of the workpiece. Furthermore, when a paddle is used to agitate the flow adjacent to the microfeature workpiece, it can create "shadows" in the electrical field within the electrolyte, causing undesirable nonuniformities in the deposition or removal of material from the microfeature workpiece. Still further, a potential drawback associated with rotating paddles is that they may be unable to accurately control radial variations in the material application/removal process, because the speed of the paddle relative to the workpiece varies as a function of radius and has a singularity at the center of the workpiece.

SUMMARY

The present invention is a paddle reactor and method for providing enhanced mass transfer of an electrochemical solution to or from the surface of a microfeature workpiece. The paddle reactor of this invention includes a paddle configuration that reduces local electric field shielding caused by a paddle moving between an electrode and the workpiece. The paddle reactor of this invention also includes a paddle enclosure that confines paddle agitation to the vicinity of the workpiece to enhance mass transfer.

A particularly useful embodiment of the paddle reactor of this invention incorporates an array of paddles, each of which has a paddle configuration that reduces local electric field shielding at the location where the workpiece is electrochemically processed. For example, the paddles may have canted surfaces that extend downwardly from the process location, or the paddles may be porous. In this embodiment, the paddle array is confined in a paddle enclosure adjacent to the process location. In this embodiment, the paddle enclosure is positioned between the electrode and the workpiece. An element that is flow-resistive to the electrochemical solution may be positioned between the paddle array and the electrode, as a partition that is part of the lower wall of the paddle enclosure. The flow-resistive partition, if present, is highly resistive to solution flow but is only moderately resistive to the passage of electric current. When this paddle reactor embodiment is configured as an electroplating reactor, the electrode functions as an anode and is configured to provide a uniform film deposit on the workpiece, whether or not the flow-resistive partition is present. The stroke and frequency of the paddle array reciprocations may be controlled to further reduce local electric field shielding. The paddles of the array may have different shapes to control three-dimensional flow effects that might otherwise result as the array reciprocates adjacent to a circular workpiece.

DETAILED DESCRIPTION

As used herein, the terms "microfeature workpiece" and "workpiece" refer to substrates on and/or in which microelectronic devices or other microdevices are integrally formed. Typical microdevices include microelectronic circuits or components, thin-film recording heads, data storage elements, microfluidic devices, and other products. Micromachines or micromechanical devices are included within this definition because they are manufactured using much of the same technology that is used in the fabrication of integrated circuits. The substrates can be semiconductive pieces (e.g., doped silicon wafers or gallium arsenide wafers), nonconductive pieces (e.g., various ceramic substrates), or conductive pieces. In some cases the workpieces are generally round and in other cases the workpieces have other shapes, including rectilinear shapes.

Several examples of reactors in accordance with the invention are set forth in FIGS. 1-11F and the following text to provide a thorough understanding of particular embodiments of the invention. The description is divided into the following sections: (A) Embodiments of Reactors Having Enclosed Paddle Chambers; (B) Embodiments of Paddles for Paddle Chambers; and (C) Embodiments of Reactors Having Paddles and Reciprocation Schedules to Reduce Electric Field Shielding. A person skilled in the art will understand, however, that the invention may have additional embodiments, and that the invention may be practiced without several of the details of the embodiments shown in FIGS. 1-11F.

A. Embodiments of Reactors Having Enclosed Paddle Chambers

Figure 1:
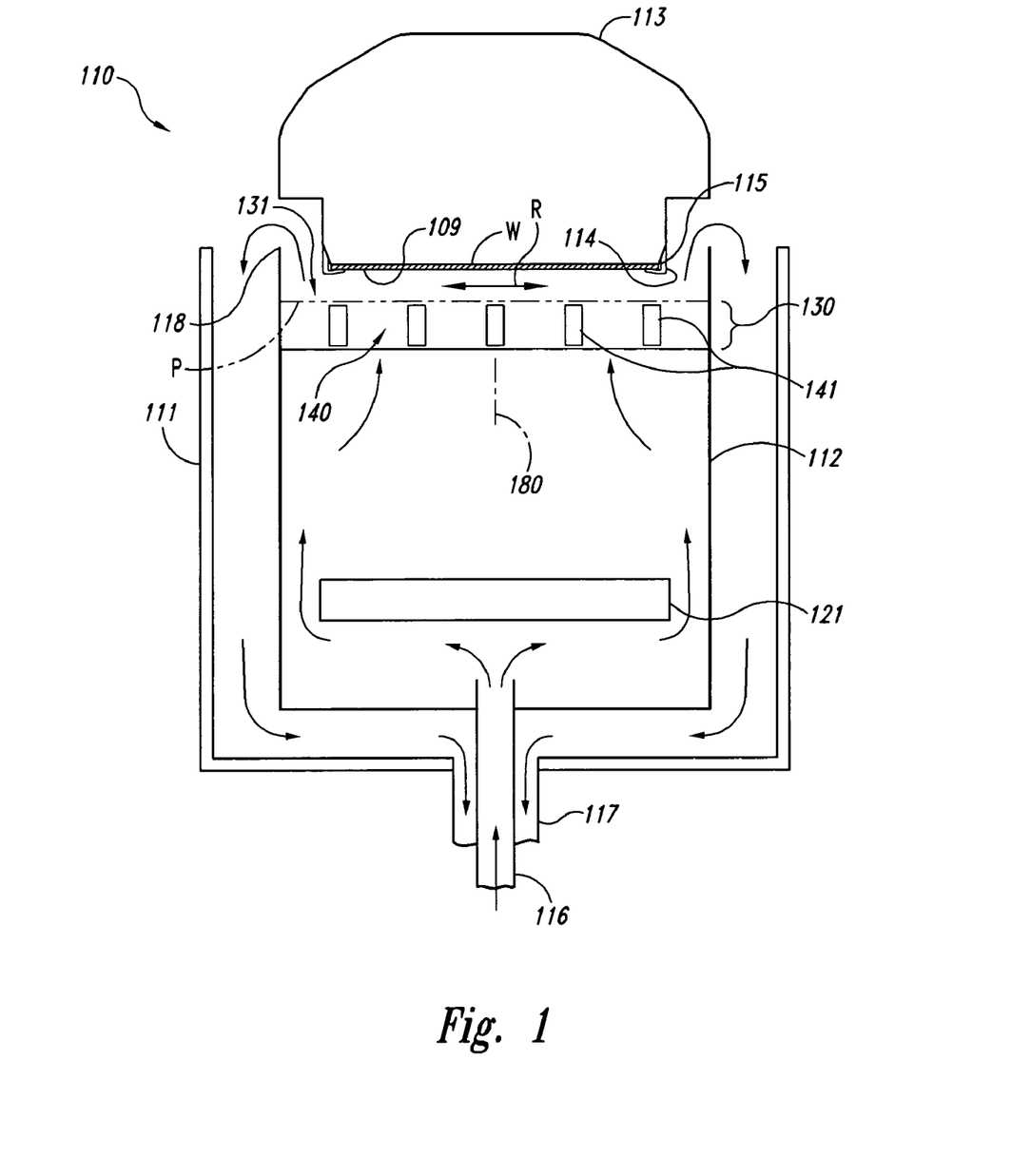
FIG. 1 is a schematic illustration of a reactor having a paddle device disposed in an enclosed paddle chamber in accordance with an embodiment of the invention.

FIG. 1 is a schematic illustration of a reactor 110 configured to process microfeature workpieces in accordance with an embodiment of the invention. The reactor 110 includes an inner vessel 112 disposed within an outer vessel 111. Processing fluid (e.g., an electrolyte) is supplied to the inner vessel 112 at an inlet 116 and flows upwardly over a weir 118 to the outer vessel 111. The processing fluid exits the reactor 110 at a drain 117. An electrode 121 is positioned in the inner vessel 112 and a paddle chamber 130 is positioned downstream of the electrode 121. The paddle chamber 130 includes a paddle device 140 having paddles 141 that reciprocate back and forth relative to a central position 180, as indicated by arrow R. The paddle chamber 130 also has an aperture 131 defining a process location P. A microfeature workpiece W is supported at the process location P by a workpiece support 113, so that a downwardly facing process surface 109 of the workpiece W is in contact with the processing fluid. The workpiece support 113 can rotate or not rotate, depending on the nature of the process carried out on the workpiece W. The workpiece support 113 also includes a workpiece contact 115 (e.g., a ring contact) that supplies electrical current to the front surface or back surface of the workpiece W. A seal 114 extends around the workpiece contact 115 to protect it from exposure to the processing fluid. In another arrangement, the seal 114 can be eliminated.

During electrolytic deposition, the workpiece contact 115 and the workpiece W function as a cathode, and the electrode 121 functions as an anode. The processing fluid flows past the electrode 121 and through the paddle chamber 130 to supply ions to the process surface 109 of the workpiece W. During electroetching, the workpiece W functions as an anode and the electrode 121 functions as a cathode to remove material from the process surface 109. In other embodiments, the mass transfer process includes other deposition processes (e.g., electroless deposition) or other material removal processes. In any of these arrangements, the processing fluid flows through the paddle chamber 130 while the paddles 141 reciprocate adjacent to the workpiece W to enhance the mass transfer process taking place at the process surface 109. The shapes, sizes and configurations of the paddles 141, the manner in which they reciprocate, and the confined volume of the paddle chamber 130 further enhance the mass transfer process and reduce the impact of the paddles 141 on the electric field in the reactor 110.

Figure 2:
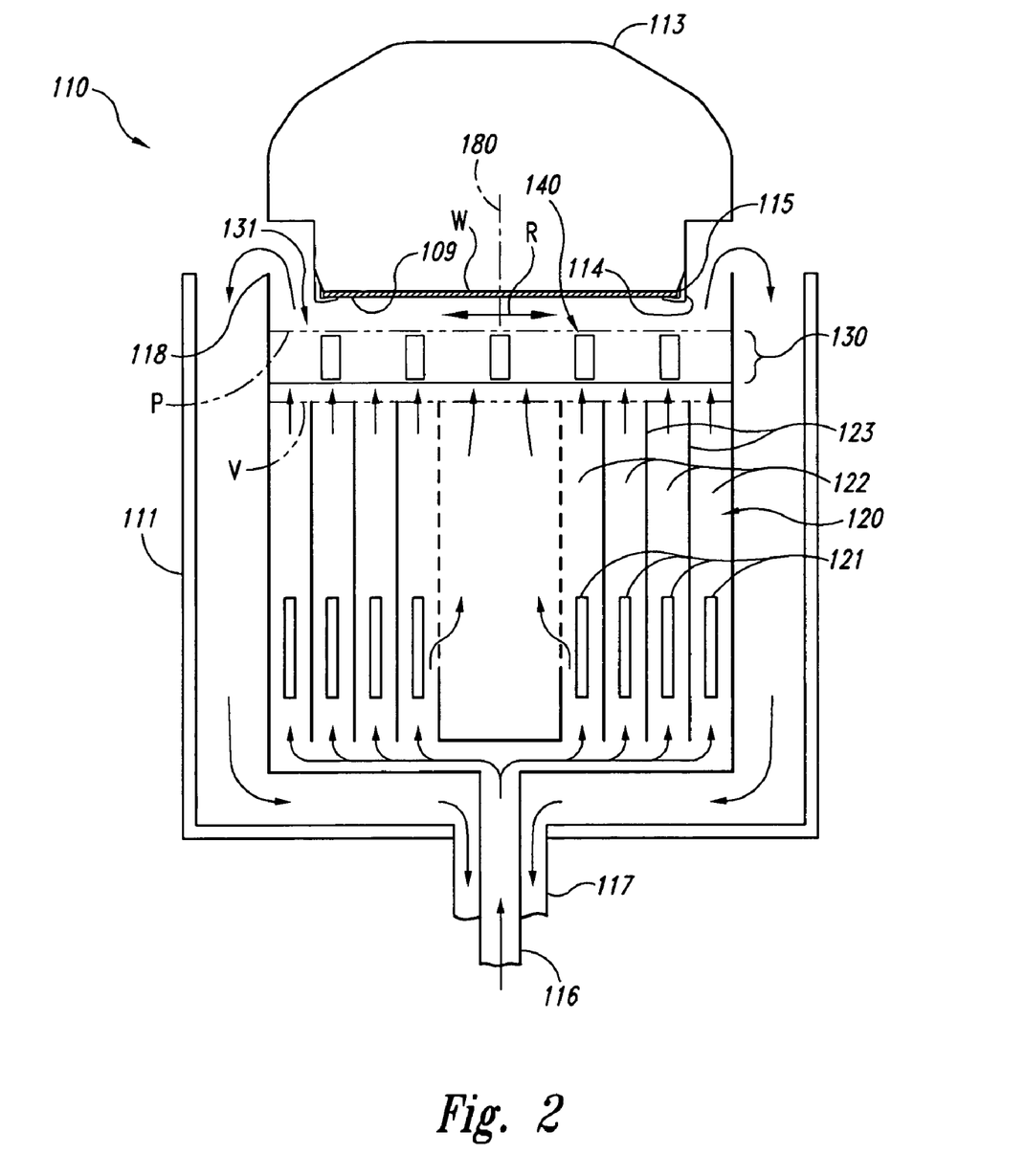
FIG. 2 is a schematic illustration of another embodiment of a reactor having multiple electrodes in accordance with another embodiment of the invention.

FIG. 2 is a schematic illustration of the reactor 110 having an electrode support 120 configured in accordance with another embodiment of the invention. The electrode support 120 includes a plurality of generally annular electrode compartments 122, separated by compartment walls 123. A corresponding plurality of annular electrodes 121 are positioned in the electrode compartments 122. The compartment walls 123 are formed from a dielectric material, and the gaps between the top edges of the compartment walls 123 define a composite virtual anode location V just beneath the paddle chamber 130. As used herein, the term "virtual anode location" or "virtual electrode location" refers to a plane spaced apart from the physical anodes or electrodes through which all the current flux for one or more of the electrodes or anodes passes. The polarity of the electrical potential applied to each of the electrodes 121, and/or the current flowing through each of the electrodes 121, may be selected to control a manner in which material is added to or removed from the workpiece W at the process location P. In addition, the paddle device 140 enhances the mass transfer process occurring at the process surface 109. Further details of the paddle device 140 and its operation are described below with reference to FIGS. 3-11F.

Figure 3:
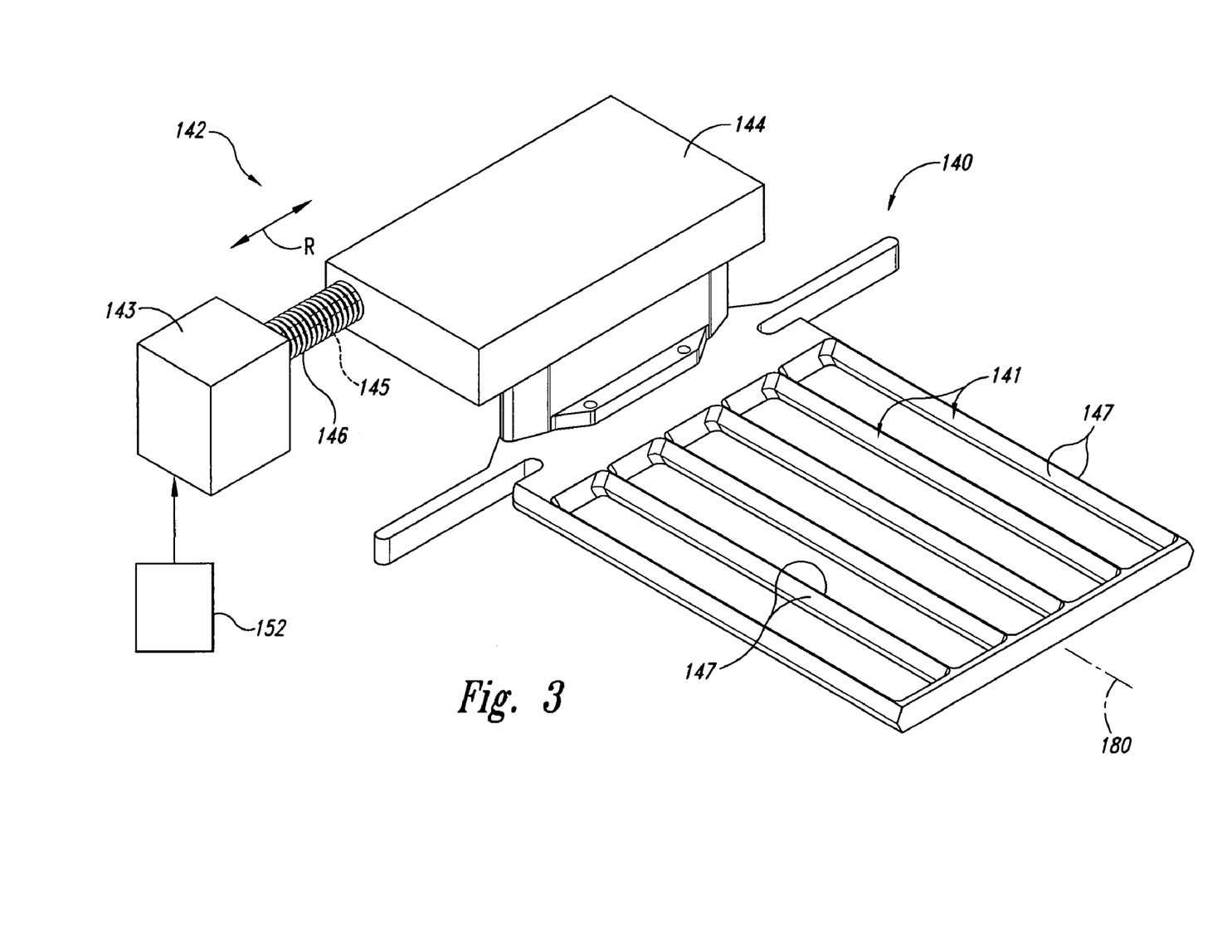
FIG. 3 is a partially schematic, isometric illustration of an actuated paddle device in accordance with an embodiment of the invention.

FIG. 3 is a partially schematic, isometric illustration of a paddle system 142 having a paddle device 140 in accordance with an embodiment of the invention. The paddle device 140 includes a plurality of paddles 141 (six are shown in FIG. 3), each having outwardly facing paddle surfaces 147. Accordingly, neighboring paddles 141 have paddle surfaces 147 that are spaced apart from each other. The paddle device 140 further includes a support 144 that is driven by a motor 143 to move the paddle device 140 in a linear, reciprocal manner, as indicated by arrow R. The motor 143 is coupled to the support 144 with a coupler 145 (e.g., a lead screw). A bellows 146 is positioned around the coupler 145 and protects the coupler 145 from exposure to the processing fluid described above with reference to FIGS. 1 and 2. A controller 152 directs the motion of the paddle device 140. Elongated flow restrictors extend transverse to the paddles to restrict and/or prevent fluid from escaping directly out of the paddle chamber 130 (FIG. 2). As discussed below, the paddles 141 are shaped to agitate the processing fluid in which they reciprocate, without creating a significant impact on the local electric field.

B. Embodiments of Paddles for Paddle Chambers

FIGS. 4A-4G illustrate paddles 441a-441g, respectively, having shapes and other features in accordance with further embodiments of the invention. Each of the paddles (referred to collectively as paddles 441) has opposing paddle surfaces 447 (shown as paddle surfaces 447a-447g) that are inclined at an acute angle relative to a line extending normal to the process location P. This provides the paddles 441 with a downwardly tapered shape that reduces the likelihood and/or magnitude for shadowing or otherwise adversely influencing the electric field created by the electrode or electrodes 121 (FIG. 4A) while maintaining the structural integrity of the paddles. The overall maximum width of each paddle is generally kept as small as possible to further reduce shadowing. For example, the paddle 441a (FIG. 4A) has a generally diamond-shaped cross-sectional configuration with flat paddle surfaces 447a. The paddle 441b (FIG. 4B) has concave paddle surfaces 447b. The paddle 441c (FIG. 4C) has convex paddle surfaces 447c, and the paddle 441d (FIG. 4D) has flat paddle surfaces 447d positioned to form a generally triangular shape. In other embodiments, the paddles 441 have other shapes that also agitate the flow at the process location P and reduce or eliminate the extent to which they shadow the electrical field created by the nearby electrode or electrodes 121.

Figure 4A:
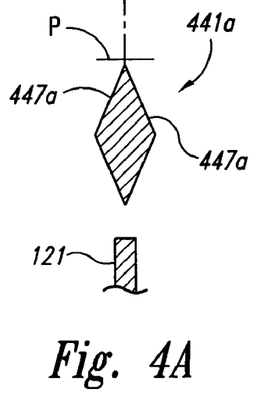
FIGS. 4A-4G illustrate paddles having shapes and configurations in accordance with further embodiments of the invention.
Figure 4B:
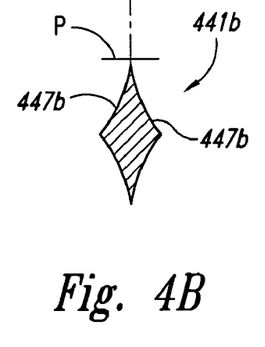
Figure 4C:
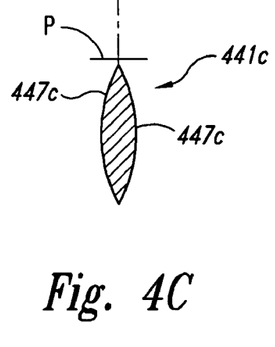
Figure 4D:
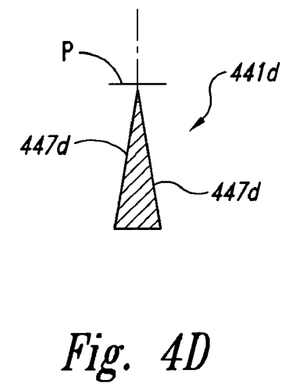
Figure 4E:
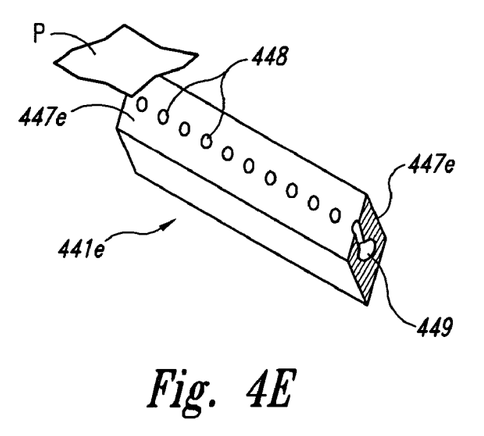

The agitation provided by the paddles 441 may also be supplemented by fluid jets. For example, the paddle 441e (FIG. 4E) has canted paddle surfaces 447e that house jet apertures 448. The jet apertures 448 can be directed generally normal to the process location P (as shown in FIG. 4E); alternatively, the jet apertures 448 can be directed at other angles relative to the process location P. The processing fluid is provided to the jet apertures 448 via a manifold 449 internal to the paddle 441e. Jets of processing fluid exiting the jet apertures 448 increase the agitation at the process location P and enhance the mass transfer process taking place at the process surface 109 of the workpiece W (FIG. 1). Aspects of other paddle arrangements are disclosed in U.S. Pat. No. 6,547,937 incorporated herein in its entirety by reference.

Figure 4F:
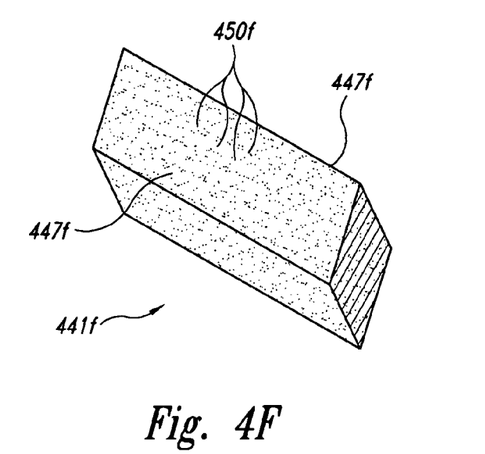
Figure 4G:
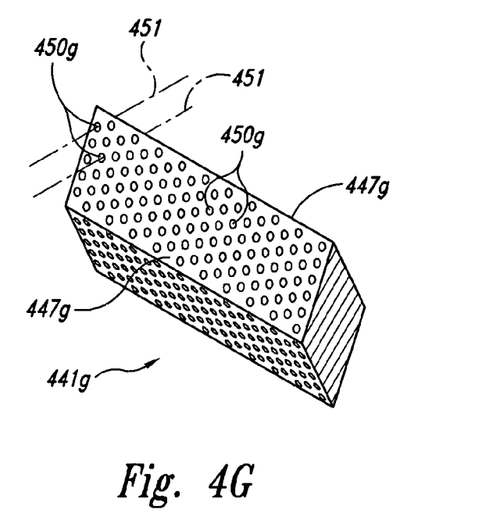

FIGS. 4F and 4G illustrate paddles having perforations or other openings that allow the processing fluid to flow through the paddles from one side to the other as the paddles move relative to the processing fluid. For example, referring first to FIG. 4F, the paddle 441f has opposing paddle surfaces 447f, each with pores 450f. The volume of the paddle 441f between the opposing paddle surfaces 447f is also porous to allow the processing fluid to pass through the paddle 441f from one side surface 447f to the other. The paddle 441f may be formed from a porous metal (e.g., titanium) or other materials, such as porous ceramic materials. FIG. 4G illustrates a paddle 441g having paddle surfaces 447g with through-holes 450g arranged in accordance with another embodiment of the invention. Each of the through-holes 450g extends entirely through the paddle 441g along a hole axis 451, from one paddle surface 447g to the opposing paddle surface 447g.

One feature of the paddles described above with reference to FIGS. 4F and 4G is that the holes or pores have the effect of increasing the transparency of the paddles to the electric field in the adjacent processing fluid. An advantage of this arrangement is that the pores or holes reduce the extent to which the paddles add a three-dimensional component to the electric fields proximate to the workpiece W, and/or the extent to which the paddles shadow the adjacent workpiece W. Nonetheless, the paddles still enhance the mass transfer characteristics at the surface of the workpiece W by agitating the flow there. For example, the holes or pores in the paddles are sized so that the viscous effects of the flow through the paddles are strong, and the corresponding restriction by the paddles to the flow passing through is relatively high. Accordingly, the porosity of the paddles can be selected to provide the desired level of electric field transparency while maintaining the desired level of fluid agitation.

Figure 5:
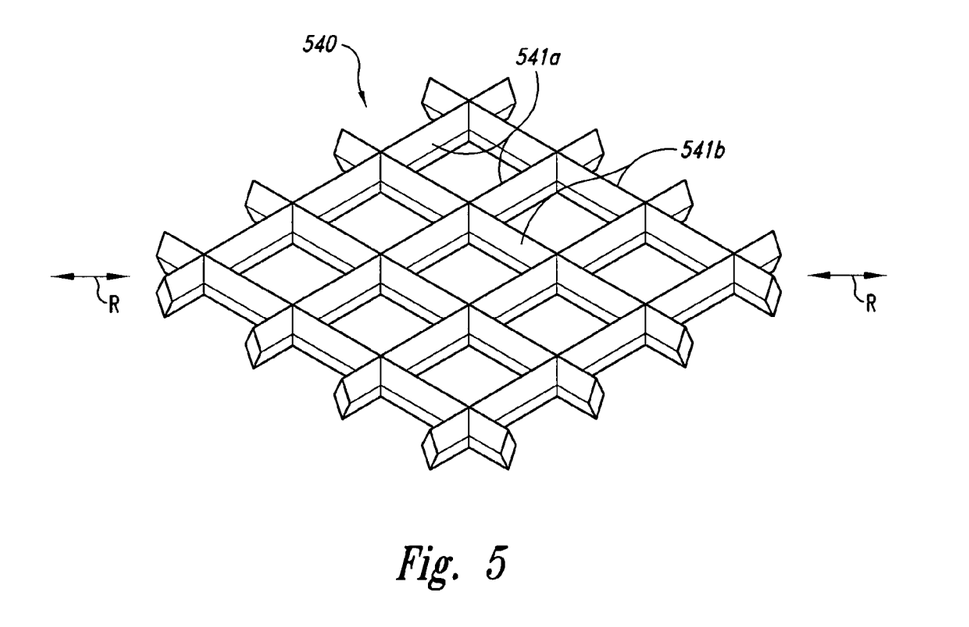
FIG. 5 is an isometric illustration of a paddle device having a grid configuration.

FIG. 5 is a partially schematic illustration of a paddle device 540 having a three-dimensional arrangement of paddles 541 (shown in FIG. 5 as first paddles 541a and second paddles 541b). The paddles 541a, 541b are arranged to form a grid, with each of the paddles 541a, 541b oriented at an acute angle relative to the motion direction R (as opposed to being normal to the motion direction R). Accordingly, the grid arrangement of paddles 541 can increase the agitation created by the paddle device 540 and create a more uniform electric field.

One aspect of the present invention is that, whatever shape and configuration the paddles have, they reciprocate within the confines of a close-fitting paddle chamber. The confined volume of the paddle chamber further enhances the mass transfer effects at the surface of the workpiece W. Further details of the paddle chamber and the manner in which the paddles are integrated with the paddle chamber are described below with reference to FIGS. 6-11F.

Figure 6:
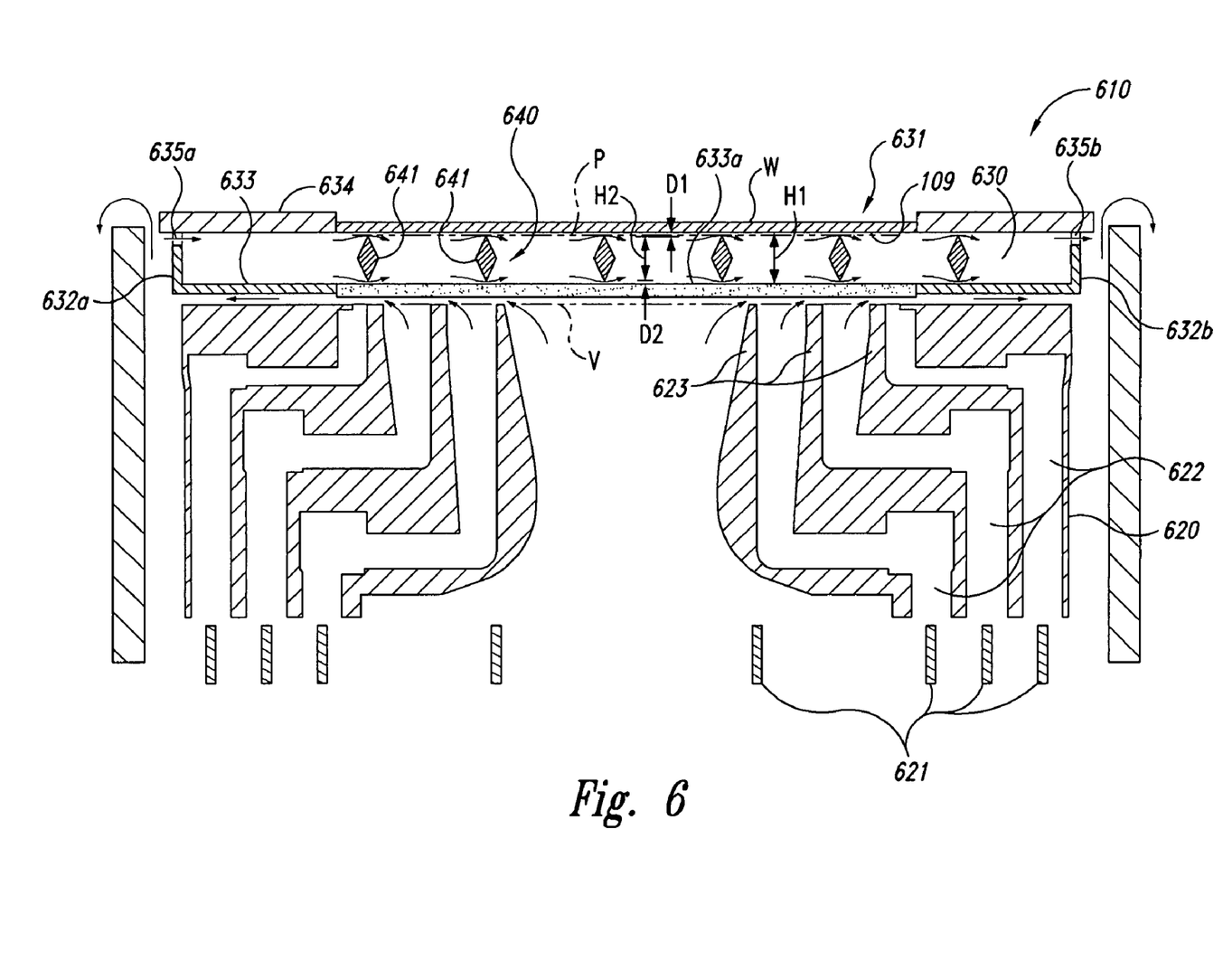
FIG. 6 schematically illustrates flow into and out of a paddle chamber in accordance with an embodiment of the invention.

C. Embodiments of Reactors Having Paddles and Reciprocation Schedules to Reduce Electric Field Shielding and Improve Mass Transfer Uniformity FIG. 6 is a schematic illustration of the upper portion of a reactor 610 having a paddle device 640 disposed in a closely confined paddle chamber 630 in accordance with an embodiment of the invention. The chamber 630 includes a top 634 having an aperture 631 to receive the workpiece W at the process location P. Opposing chamber walls 632 (shown as a left wall 632a and a right wall 632b) extend downwardly away from the top 634 to a base 633 that faces toward the process location P.

The paddle device 640 includes a plurality of paddles 641 positioned between the process location P and the chamber base 633. The paddle chamber 630 has a height H1 between the process location P and the chamber base 633, and the paddles 641 have a height H2. The tops of the paddles 641 are spaced apart from the process location P by a gap distance D1, and the bottoms of the paddles 641 are spaced apart from the chamber base 633 by a gap distance D2. In order to increase the level of agitation in the paddle chamber 630 and in particular at the process location P, the paddle height H2 is a substantial fraction of the chamber height H1, and the gap distances D1 and D2 are relatively small. In a particular example, the paddle height H2 is at least 30% of the chamber height H1. In further particular examples, the paddle height H2 is equal to at least 70%, 80%, 90% or more of the chamber height H1. The chamber height H1 can be 30 millimeters or less, e.g., from about 10 millimeters to about 15 millimeters. When the chamber height H1 is about 15 millimeters, the paddle height H2 can be about 10 millimeters, with the gap distances D1 and D2 ranging from about 1 millimeter or less to about 5 millimeters. In yet a further particular example, the chamber height H1 is 15 millimeters, the paddle height H2 is about 11.6 millimeters, D1 is about 2.4 millimeters and D2 is about 1 millimeter. Other arrangements have different values for these dimensions. In any of these arrangements, the amount of flow agitation within the paddle chamber 630 is generally correlated with the height H2 of the paddles 641 relative to the height H1 of the paddle chamber 630, with greater relative paddle height generally causing increased agitation, all other variables being equal.

The plurality of paddles 641 more uniformly and more completely agitates the flow within the paddle chamber 630 (as compared with a single paddle 641) to enhance the mass transfer process at the process surface 109 of the workpiece W. The narrow clearances between the edges of the paddles 641 and (a) the workpiece W above and (b) the chamber base 633 below, within the confines of the paddle chamber 630, also increase the level of agitation at the process surface 109. In particular, the movement of the multiple paddles 641 within the small volume of the paddle chamber 630 forces the processing fluid through the narrow gaps between the paddles 641 and the workpiece W (above) and the chamber base 633 (below). The confined volume of the paddle chamber 630 also keeps the agitated flow proximate to the process surface 109.

An advantage of the foregoing arrangement is that the mass transfer process at the process surface 109 of the workpiece W is enhanced. For example, the overall rate at which material is removed from or applied to the workpiece W is increased. In another example, the composition of alloys deposited on the process surface 109 is more accurately controlled and/or maintained at target levels. In yet another example, the foregoing arrangement increases the uniformity with which material is deposited on features having different dimensions (e.g., recesses having different depths and/or different aspect ratios), and/or similar dimensions. The foregoing results can be attributed to reduced diffusion layer thickness and/or other mass transfer enhancements resulting from the increased agitation of the processing fluid.

The processing fluid enters the paddle chamber 630 by one or both of two flow paths. Processing fluid following a first path enters the paddle chamber 630 from below. Accordingly, the processing fluid passes through electrode compartments 622 of an electrode support 620 located below the paddle chamber 630. The processing fluid passes laterally outwardly through gaps between compartment walls 623 and the chamber base 633. The chamber base 633 includes a permeable base portion 633a through which at least some of the processing fluid passes upwardly into the paddle chamber 630. The permeable base portion 633a includes a porous medium, for example, porous aluminum ceramic with 10 micron pore openings and approximately 50% open area. Alternatively, the permeable base portion 633a may include a series of through-holes or perforations. For example, the permeable base portion 633a may include a perforated plastic sheet. With any of these arrangements, the processing fluid can pass through the permeable base portion 633a to supply the paddle chamber 630 with processing fluid; or (if the permeable base portion 633a is highly flow restrictive) the processing fluid can simply saturate the permeable base portion 633a to provide a fluid and electrical communication link between the process location P and annular electrodes 621 housed in the electrode support 620, without flowing through the permeable base portion 633a at a high rate. Alternatively (for example, if the permeable base portion 633a traps bubbles that interfere with the uniform fluid flow and/or electrical current distribution), the permeable base portion 633a can be removed, and (a) replaced with a solid base portion, or (b) the volume it would normally occupy can be left open.

Processing fluid following a second flow path enters the paddle chamber 630 via a flow entrance 635a. The processing fluid flows laterally through the paddle chamber 630 and exits at a flow exit 635b. The relative volumes of processing fluid proceeding along the first and second flow paths can be controlled by design to (a) maintain electrical communication with the electrodes 621 and (b) replenish the processing fluid within the paddle chamber 630 as the workpiece W is processed.

Figure 7:
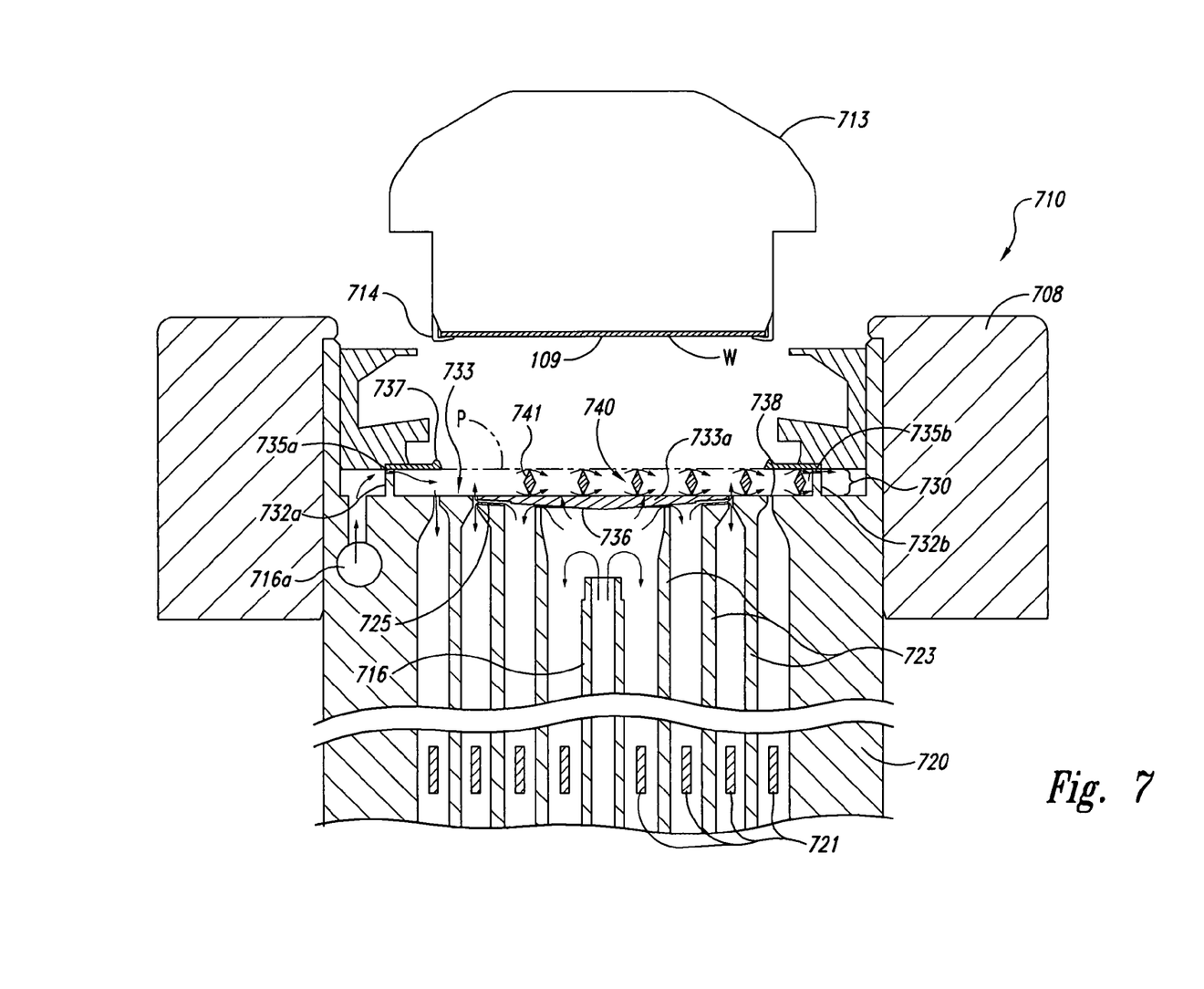
FIG. 7 is a partially schematic illustration of a reactor having a paddle chamber in accordance with another embodiment of the invention.

FIG. 7 illustrates a reactor 710 having a paddle chamber 730, a paddle device 740, and other features arranged in a particular embodiment of the invention. Further details of a reactor having generally similar features, and tools in which such reactors are housed, are included pending U.S. application Ser. No. 10/734,100, entitled "Reactors Having Multiple Electrodes and/or Enclosed Reciprocating Paddles, and Associated Methods," and U.S. application Ser. No. 10/733,807, entitled "Integrated Microfeature Workpiece Processing Tools With Registration Systems for Paddle Reactors," both filed concurrently herewith and incorporated herein in their entireties by reference. The paddle chamber 730 is positioned above an electrode support 720 having spaced apart compartment walls 723 housing concentric annular electrodes 721. Processing fluid is supplied to the reactor 710 via a centrally disposed vessel supply 716. The processing fluid flows radially outwardly through wall gaps 725 between the tops of the compartment walls 723 and the base 733 of the paddle chamber 730. The processing fluid then flows downwardly over the electrodes 721. The processing fluid also flows upwardly into the paddle chamber 730 through a permeable base portion 733a, and through base gaps 738 defined by spaces between the tops of the neighboring compartment walls 723. Some processing fluid may also (a) exit the paddle chamber 730 as it is forced through the base gaps 738 by the advancing paddles 741 and/or (b) enter the paddle chamber 730 in the wakes of the paddles 741. The processing fluid also enters the paddle chamber 730 through a separate entrance port 716a and an entrance gap 735a positioned above the left wall 732a of the paddle chamber 730. This flow proceeds laterally through the paddle chamber 730 to the right wall 732b and an exit gap 735b.

The permeable base portion 733a shown in FIG. 7 has an upwardly canted conical lower surface 736. Accordingly, if bubbles are present in the processing fluid beneath the base 733, they will tend to migrate radially outwardly along the lower surface 736 until they enter the paddle chamber 730 through the base gaps 738. Once the bubbles are within the paddle chamber 730, the paddles 741 of the paddle device 740 tend to move the bubbles toward the exit gap 735b where they are removed. As a result, bubbles within the processing fluid will be less likely to interfere with the application or removal process taking place at the process surface 109 of the workpiece W.

The workpiece W (e.g., a round workpiece W having a diameter of 150 millimeters, 300 millimeters, or other values) is supported by a workpiece support 713 having a support seal 714 that extends around the periphery of the workpiece W. When the workpiece support 713 lowers the workpiece W to the process location P, the support seal 714 can seal against a chamber seal 737 located at the top of the paddle chamber 730 and/or to allow the workpiece W to spin or rotate. Alternatively, the support seal 714 can be spaced apart from the chamber seal 737 to allow fluid and/or gas bubbles to pass out of the paddle chamber 730. The processing fluid exiting the paddle chamber 730 through the exit gap 735b rises above the level of the chamber seal 737 before exiting the reactor 710. Accordingly, the chamber seal 737 will tend not to dry out and is therefore less likely to form crystal deposits, which can interfere with its operation. The chamber seal 737 remains wetted when the workpiece support 713 is moved upwardly from the process location P (as shown in FIG. 7) and, optionally, when the workpiece support 713 carries the workpiece W at the process location P.

The reactor 710 can include a generally ring-shaped magnet 708 disposed adjacent to the process location P. The magnet 708 includes a permanent magnet and/or an electromagnet positioned to orient molecules of material applied to the workpiece W in a particular direction. For example, such an arrangement is used to apply permalloy and/or other magnetically directional materials to the workpiece W, e.g., through a patterned photoresist.

Because the workpiece W is typically not rotated when magnetically directional materials are applied to it, the linearly reciprocating motion of the plurality of paddles 741 is a particularly significant method by which to reduce the diffusion layer thickness by an amount that would otherwise require very high workpiece spin rates to match. For example, a paddle device 740 having six paddles 741 moving at 0.2 meters/second can achieve an iron diffusion layer thickness of less than 18 microns in a permalloy bath. Without the paddles, the workpiece W would have to be spun at 500 rpm to achieve such a low diffusion layer thickness, which is not feasible when depositing magnetically responsive materials.

Figure 8A:
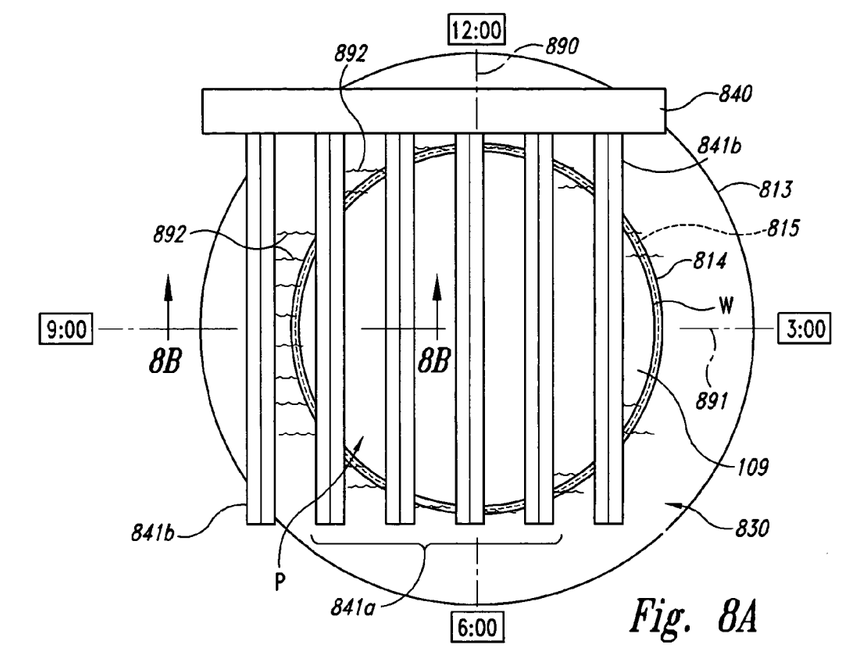
FIGS. 8A-8B illustrate a bottom plan view and a cross-sectional view, respectively, of a portion of a paddle chamber having paddles of different sizes in accordance with yet another embodiment to the invention.
Figure 8B:
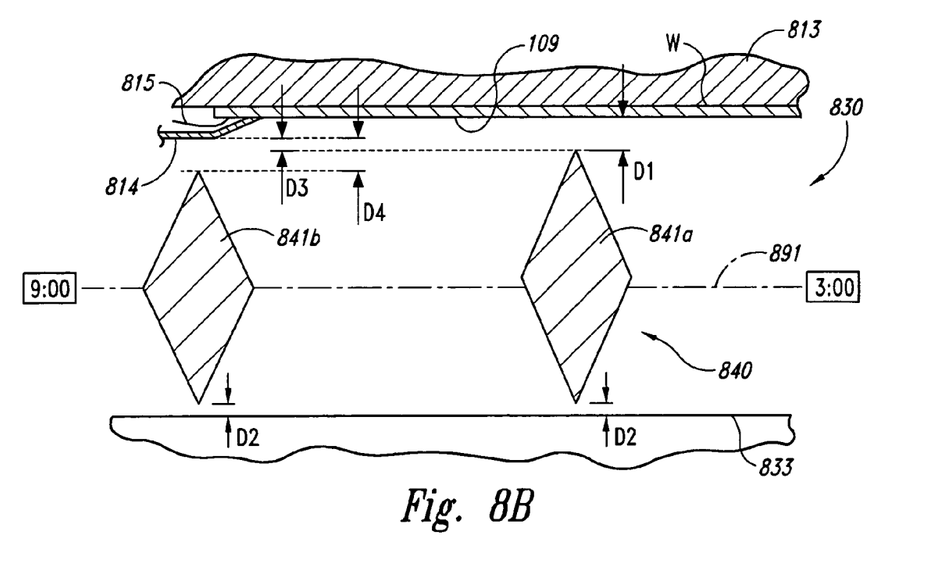

As the linearly elongated paddles described above reciprocate transversely beneath a circular workpiece W, they may tend to create three-dimensional effects in the flow field adjacent to the workpiece W. Embodiments of the invention described below with reference to FIGS. 8A-10 address these effects. For example, FIG. 8A is a partially schematic view looking upwardly at a workpiece W positioned just above a paddle device 840 housed in a paddle chamber 830. FIG. 8B is a partially schematic, cross-sectional view of a portion of the workpiece W and the paddle device 840 shown in FIG. 8A, positioned above a chamber base 833 of the paddle chamber 830 and taken substantially along lines 8B-8B of FIG. 8A. As discussed below, the paddle device 840 includes paddles having different shapes to account for the foregoing three-dimensional effects.

Referring first to FIG. 8A, the paddle device 840 includes a plurality of paddles 841 (shown as four inner paddles 841a positioned between two outer paddles 841b). The paddles 841 are elongated generally parallel to a paddle elongation axis 890, and reciprocate back and forth along a paddle motion axis 891, in a manner generally similar to that described above. The workpiece W is carried by a workpiece support 813 which includes a support seal 814 extending below and around a periphery of the downwardly facing process surface 109 of the workpiece W to seal an electrical contact assembly 815.

Because the support seal 814 projects downwardly away from the process surface 109 of the workpiece W (i.e., outwardly from the plane of FIG. 8A), the paddles 841 are spaced more closely to the support seal 814 than to the process surface 109. When the paddles 841 move back and forth, passing directly beneath the support seal 814, they can form vortices 892 and/or high speed jets as flow accelerates through the relatively narrow gap between the paddles 841 and the support seal 814. For example, the vortices 892 can form as the paddles 841 pass beneath and beyond the support seal 814, or the vortices 892 can form when the paddles 841 become aligned with the support seal 814 and then pass back over the process surface 109 of the workpiece W. These vortices 892 may not have a significant impact on the mass transfer at the process surface 109 where the support seal 814 is generally parallel to the paddle motion axis 891 (e.g., proximate to the 12:00 and 6:00 positions shown in FIG. 8A), but can have more substantial effects where the support seal 814 is transverse to the paddle motion axis 891 (e.g., proximate to the 3:00 and 9:00 positions of FIG. 8A). As discussed in greater detail below with reference to FIG. 8B, the outer agitator elements 841b (aligned with outer regions of the workpiece W and the process location P) can have a different size than the inner agitator elements 841a (aligned with the inner regions of the workpiece W and the process location P) to counteract this effect.

FIG. 8B illustrates the left outer paddle 841b and the leftmost inner paddle 841a shown in FIG. 8A. The inner paddle 841a is spaced apart from the workpiece W by a gap distance D1 and from the chamber base 833 by a gap distance D2. If the inner paddle 841a were to reciprocate back and forth beneath the support seal 814 at the 9:00 position, significant portions of the inner paddle 841a would be spaced apart from the support seal 814 by a gap distance D3, which is significantly smaller than the gap distance D1. As discussed above, this can cause vortices 892 (FIG. 8A) to form, and such vortices can more greatly enhance the mass transfer characteristics at the process surface 109 of the workpiece W at this position than at other positions (e.g., the 12:00 or 6:00 positions). Alternatively, vortices 892 can form across the entire process surface 109, but can be stronger at the 9:00 (and 3:00) positions than at the 12:00 (and 6:00) positions.

To counteract the foregoing effect, the outer paddle 841b has a different (e.g., smaller) size than the inner paddle 841a so as to be spaced apart from the support seal 814 by a gap distance D4, which is approximately equal to the gap distance D1 between the inner paddle 841a and the workpiece W. Accordingly, the enhanced mass transfer effect at the periphery of the workpiece W (and in particular, at the periphery proximate to the 3:00 and 9:00 positions shown in FIG. 8A) can be at least approximately the same as the enhanced mass transfer effects over the rest of the workpiece W.

Figure 9:
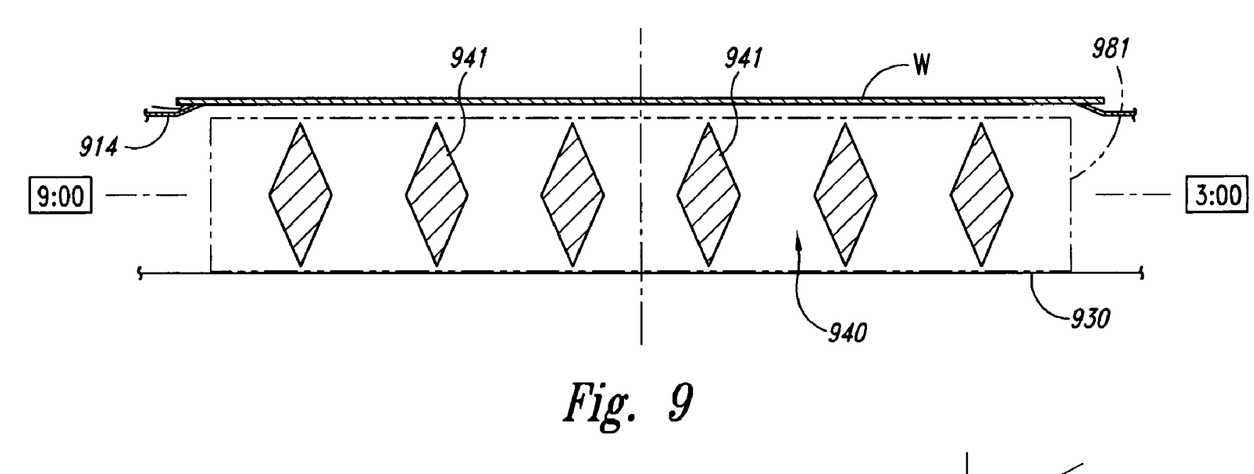
FIG. 9 is a cross-sectional view of a plurality of paddles that reciprocate within an envelope in accordance with another embodiment of the invention.

FIG. 9 is a cross-sectional illustration of a paddle device 940 positioned in a paddle chamber 930 in accordance with another embodiment of the invention. The paddle device 940 includes paddles 941 configured to move within the paddle chamber 930 in a manner that also reduces disparities between the mass transfer characteristics at the periphery and the interior of the workpiece W. In particular, the paddles 941 move back and forth within an envelope 981 that does not extend over a support seal 914 proximate to the 3:00 and 9:00 positions. Accordingly, the paddles 941 are less likely to form vortices (or disparately strong vortices) or other flow field disparities adjacent to the workpiece W proximate to the 3:00 and 6:00 positions.

Figure 10:
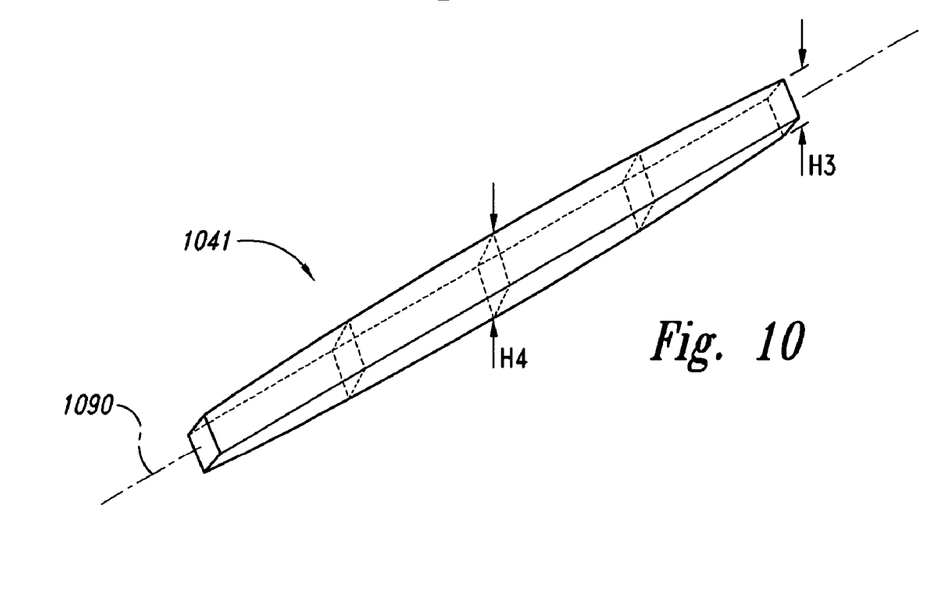
FIG. 10 is a partially schematic, isometric illustration of a paddle having a height that changes over its length.
Figure 11A:
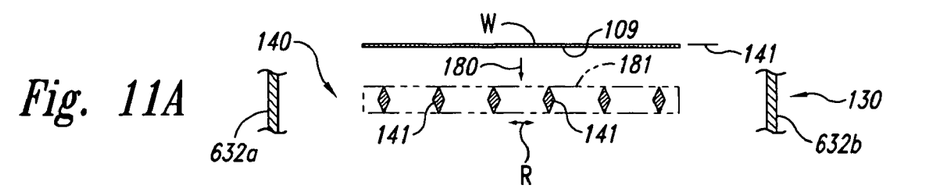
FIGS. 11A-11F schematically illustrate a pattern for shifting the reciprocation stroke of paddles in accordance with an embodiment of the invention.
Figure 11B:
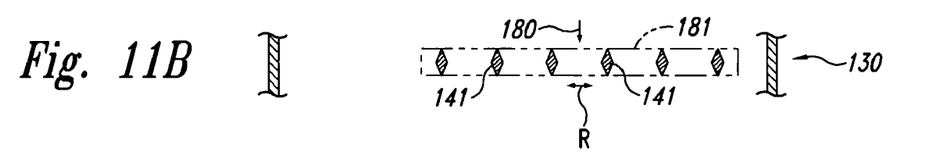
Figure 11C:
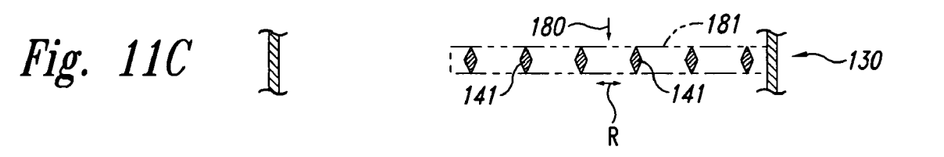
Figure 11D:
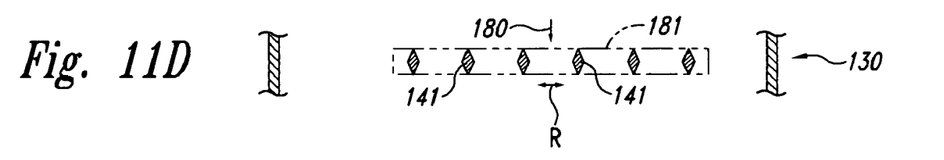
Figure 11E:
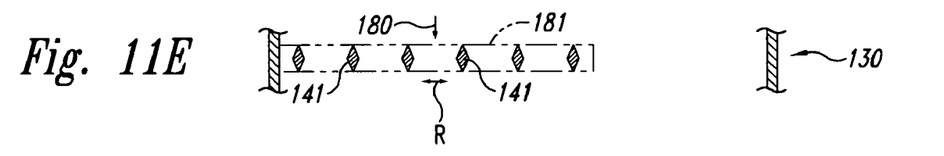
Figure 11F:
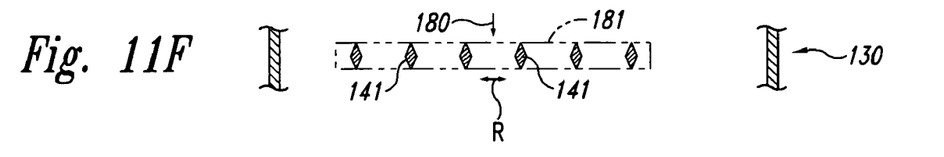

FIG. 10 is an isometric illustration of a paddle 1041 configured in accordance with another embodiment of the invention. The paddle 1041 has a height H3 proximate to its ends, and a height H4 greater than H3 at a position between the ends. More generally, the paddle 1041 can have different cross-sectional shapes and/or sizes at different positions along an elongation axis 1090. In a particular example, the inner paddles 841a described above with reference to FIG. 8A may have a shape generally similar to that of the paddle 1041 shown in FIG. 10, for example, to reduce the likelihood for creating disparately enhanced mass transfer effects proximate to the 12:00 and 6:00 positions shown in FIG. 8A.

Any of the paddle devices described above with reference to FIGS. 1-10 can reciprocate in a changing, repeatable pattern. For example, in one arrangement shown in FIGS. 11A-11F, the paddle device 140 reciprocates one or more times from the central position 180, and then shifts laterally so that the central position 180 for the next reciprocation (or series of reciprocations) is different than for the preceding reciprocation. In a particular embodiment shown in FIGS. 11A-11F, the central position 180 shifts to five points before returning to its original location. At each point, the paddle device 140 reciprocates within an envelope 181 before shifting to the next point. In another particular example, the central position 181 shifts to from two to twelve or more points. When the central position 181 shifts to twelve points, at each point, the paddle device 140 reciprocates within an envelope 181 that extends from about 15-75 millimeters (and still more particularly, about 30 millimeters) beyond the outermost paddles 141, and the central position 180 shifts by about 15 millimeters from one point to the next. In other arrangements, the central position 180 shifts to other numbers of points before returning to its original location.

Shifting the point about which the paddle device 140 reciprocates reduces the likelihood for forming shadows or other undesirable patterns on the workpiece W. This effect results from at least two factors. First, shifting the central position 180 reduces electric field shadowing created by the physical structure of the paddles 141. Second, shifting the central position 180 can shift the pattern of vortices that may shed from each paddle 141 as it moves. This in turn distributes the vortices (or other flow structures) more uniformly over the process surface 109 of the workpiece W. The paddle device 140 can accelerate and decelerate quickly (for example, at about 8 meters/second$^2$) to further reduce the likelihood for shadowing. Controlling the speed of the paddles 141 will also influence the diffusion layer thickness. For example, increasing the speed of the paddles 141 from 0.2 meters/second to 2.0 meters per second is expected to reduce the diffusion layer thickness by a factor of about 3.

The number of paddles 141 may be selected to reduce the spacing between adjacent paddles 141, and to reduce the minimum stroke length over which each paddle 141 reciprocates. For example, increasing the number of paddles 141 included in the paddle device 140 can reduce the spacing between neighboring paddles 141 and reduce the minimum stroke length for each paddle 141. Each paddle 141 accordingly moves adjacent to only a portion of the workpiece W rather than scanning across the entire diameter of the workpiece W. In a further particular example, the minimum stroke length for each paddle 141 is equal to or greater than the distance between neighboring paddles 141. For any of these arrangements, the increased number of paddles 141 increases the frequency with which any one portion of the workpiece W has a paddle 141 pass by it, without requiring the paddles 141 to travel at extremely high speeds. Reducing the stroke length of the paddles 141 (and therefore, the paddle device 140) also reduces the mechanical complexity of the drive system that moves the paddles 141.

From the foregoing, it will be appreciated that specific embodiments of the invention have been described herein for purposes of illustration, but that various modifications may be made without deviating from the spirit and scope of the invention. For example, features of the paddle devices and paddle chambers described above in the context of electrolytic processing reactors are also applicable to other reactors, including electroless processing reactors. In another example, the workpiece W reciprocates relative to the paddle device. In still a further example, the workpiece W and the paddle device need not move relative to each other. In particular, fluid jets issuing from the paddle device can provide fluid agitation that enhances the mass transfer process. Nevertheless, at least some aspect of the workpiece W and/or the paddle device is activated to provide the fluid agitation and corresponding mass transfer enhancement at the surface of the workpiece W. Accordingly, the invention is not limited except as by the appended claims.

The invention claimed is:

1. A system for processing microfeature workpieces, comprising:
   a vessel configured to carry a processing fluid, the vessel having a generally planar process location positioned to receive a microfeature workpiece;
   a workpiece support positioned to carry a microfeature workpiece at the process location of the vessel;
   a paddle chamber in fluid communication with the vessel, the paddle chamber having an opening at the process location to receive a microfeature workpiece, the paddle chamber having a base portion facing the process location and being spaced apart from the process location by a first distance along a first axis generally normal to the process location, the paddle chamber further having a plurality of sidewall portions extending downwardly away from the process location, at least one of the sidewall portions including a fluid entrance at least proximate to the process location, and at least one of the sidewall portions further including a fluid exit at least proximate to the process location; and
   a paddle device disposed in the paddle chamber, the paddle device having at least one paddle positioned between the fluid entrance and the fluid exit, wherein at least one of the workpiece support and the at least one paddle is movable along a generally linear second axis to agitate processing fluid at the process location while the workpiece support carries a microfeature workpiece.

2. The system of claim 1 wherein the at least one paddle extends for a second distance generally parallel to the first axis, the second distance being at least 30% of the first distance.

3. The system of claim 1 wherein the at least one paddle extends for a second distance generally parallel to the first axis, the second distance being at least 90% of the first distance.

4. The system of claim 1 wherein a gap between the process location and an upper extremity of the at least one paddle is about five millimeters or less.

5. The system of claim 1 wherein a gap between the base portion and a lower extremity of the at least one paddle is about five millimeters or less.

6. The system of claim 1 wherein a first gap between the process location and an upper extremity of the at least one paddle is about five millimeters or less, and wherein a second gap between the base and a lower extremity of the at least one paddle is about five millimeters or less.

7. The system of claim 1 wherein the at least one paddle is spaced apart from the process location by a first gap having a first gap dimension, and wherein the at least one paddle is spaced apart from the base portion by a second gap having a second gap dimension different than the first gap dimension.

8. The system of claim 1 wherein a distance between the base portion and the process location is less than about 30 millimeters.

9. The system of claim 1 wherein a distance between the base portion and the process location is from about 10 millimeters to about 15 millimeters.

10. The system of claim 1 wherein at least part of the base portion is porous.

11. The system of claim 1, further comprising a magnet positioned proximate to the process location to orient material deposited on a microfeature workpiece at the process location.

12. The system of claim 1 wherein the base portion includes a first surface facing toward the process location and a second surface facing opposite from the first surface, and wherein the second surface is inclined to have a higher elevation toward a perimeter of the process location than toward a center of the process location.

13. The system of claim 1 wherein the paddle device is movable relative to the workpiece support back and forth along a linear path.

14. The system of claim 1 wherein the workpiece support is positioned to rotate the microfeature workpiece about an axis generally normal to a face of the microfeature workpiece.

15. The system of claim 1 wherein the paddle device has a plurality of paddles with corresponding spaced apart paddle surfaces, wherein at least one of the workpiece support and the paddle device is movable back and forth along a linear path relative to the other while the workpiece support carries a microfeature workpiece.

16. The system of claim 15 wherein the spaced apart paddle surfaces are coupled to each other to move as a unit relative to the workpiece support.

17. The system of claim 15 wherein the process location is positioned at a process plane and wherein the spaced apart paddle surfaces are inclined at an acute angle relative to the process plane.

18. The system of claim 1 wherein the at least one paddle has a first surface and a second surface facing opposite from the first surface, the first and second surfaces being canted outwardly and downwardly away from an axis positioned between the surfaces and normal to the process location, at least one of the workpiece support and the at least one paddle being movable relative to the other.

19. The system of claim 18 wherein the at least one paddle has a generally diamond shaped cross-section when intersected by a plane generally normal to the process location.

20. The system of claim 18 wherein the at least one paddle has a generally triangular cross-sectional shape when intersected by a plane generally normal to the process location.

21. The system of claim 18 wherein at least one of the first and second surfaces is curved.

22. The system of claim 1 wherein the at least one paddle includes one of a plurality of paddles.

23. The system of claim 1, further comprising a first electrode in fluid communication with the process location, and wherein the workpiece support includes a second electrode positioned to electrically couple with a microfeature workpiece when the workpiece support carries the microfeature workpiece.

24. A system for processing microfeature workpieces, comprising:
    a vessel configured to receive a processing fluid, the vessel having a process location positioned to receive a microfeature workpiece;
    a workpiece support positioned to releasably carry a microfeature workpiece at the process location of the vessel; and
    a paddle device having a plurality of paddles, with at least one of the workpiece support and the plurality of paddles being movable relative to the other along a generally linear motion axis, wherein at least a first one of the paddles is elongated along a first axis and at least a second one of the paddles is elongated along a second axis non-parallel to the first axis.

25. The system of claim 24 wherein the plurality of paddles includes a first paddle elongated along a first axis and a second paddle elongated along a second axis generally orthogonal to the first axis, and wherein the motion axis is inclined at a first acute angle relative to the first axis, the motion axis being inclined at a second acute angle relative to the second axis.

26. A system for processing microfeature workpieces, comprising:
    a vessel configured to receive a processing fluid, the vessel having a generally planar process location positioned to receive a microfeature workpiece;
    a workpiece support positioned to releasably carry a microfeature workpiece at the process location of the vessel; and
    a paddle device having a first paddle and a second paddle, with at least a portion of the second paddle being spaced apart from the first paddle, the first paddle having a first shape and size and the second paddle having a second shape and size, with the first shape being different than the second shape, or the first size being different than the second size, or both.

27. The system of claim 26 wherein the process location has an inner region positioned to be generally proximate to an inner region of the microfeature workpiece, and an outer region positioned to be generally proximate to an outer region of the microfeature workpiece, and wherein the second paddle is positioned inwardly from the first paddle, the first paddle being smaller than the second paddle.

28. The system of claim 26 wherein the first shape is geometrically similar to the second shape and wherein the first size is different than the second size.

29. The system of claim 26 wherein the workpiece support includes a generally circular seal positioned to extend around a peripheral region of the microfeature workpiece, and wherein the first paddle is elongated along an elongation axis and is positioned pass over the seal with the elongation axis generally tangent to a portion of the seal, and wherein the second paddle is positioned inwardly from the first paddle, still further wherein the first paddle is smaller than the second paddle.

30. A system for processing microfeature workpieces, comprising:
    a vessel configured to receive a processing fluid, the vessel having a generally planar process location positioned to receive a microfeature workpiece;
    a workpiece support positioned to releasably carry a microfeature workpiece at the process location of the vessel; and
    a paddle device having at least one paddle, at least one of the workpiece support and the at least one paddle being movable relative to the other along a generally linear motion axis, the at least one paddle including a generally porous material and being at least partially transmissive to the processing fluid to allow the processing fluid to pass through the at least one paddle as a result of relative motion between the at least one paddle and the workpiece support.

31. The system of claim 30 wherein the at least one paddle includes an electrically conductive material.

32. The system of claim 30 wherein the at least one paddle includes an electrically insulative material.

33. The system of claim 30 wherein the at least one paddle has a first surface, a second surface facing opposite from the first surface, and a plurality of highly flow-restrictive apertures extending through the at least one paddle from the first surface to the second surface.

34. A system for processing microfeature workpieces, comprising:
- a vessel configured to receive a processing fluid, the vessel having a generally planar process location positioned to receive a microfeature workpiece;
- a workpiece support positioned to releasably carry a microfeature workpiece at the process location of the vessel; and
- a paddle device having at least one paddle positioned in the vessel and being movable along a generally linear motion axis relative to the process location, the at least one paddle being elongated along a paddle axis, the at least one paddle having a first shape and size at a first location along the paddle axis and a second shape and size at a second location along the paddle axis, with the first shape being different than the second shape, or the first size being different than the second size, or both.

35. The system of claim 34 wherein the first shape is geometrically similar to the second shape and wherein the first size is different than the second size.

36. The system of claim 34 wherein the at least one paddle has a first end region, a second end region spaced apart from the first end region along the paddle axis, and an intermediate region between the first and second end regions, the first and second end regions extending generally normal to the process location by a first distance, the intermediate region extending generally normal to the process location by a second distance greater than the first distance.

37. A system for processing microfeature workpieces, comprising:
- a vessel configured to carry a processing fluid, the vessel having a generally planar process location positioned to receive a microfeature workpiece;
- a workpiece support positioned to carry a microfeature workpiece at the process location of the vessel;
- a paddle chamber in fluid communication with the vessel, the paddle chamber having an opening at the process location to receive a microfeature workpiece, the paddle chamber having a base portion facing the process location and being spaced apart from the process location by a first distance along a first axis generally normal to the process location, at least part of the base portion being porous; and
- a paddle device disposed in the paddle chamber, the paddle device having at least one paddle extending for a second distance generally parallel to the first axis, the second distance being at least 30% of the first distance, and wherein at least one of the workpiece support and the at least one paddle is movable along a generally linear second axis to agitate processing fluid at the process location while the workpiece support carries a microfeature workpiece.

38. A system for processing microfeature workpieces, comprising:
- a vessel configured to carry a processing fluid, the vessel having a generally planar process location positioned to receive a microfeature workpiece;
- a workpiece support positioned to carry a microfeature workpiece at the process location of the vessel;
- a paddle chamber in fluid communication with the vessel, the paddle chamber having an opening at the process location to receive a microfeature workpiece, the paddle chamber having a base portion facing the process location and being spaced apart from the process location by a first distance along a first axis generally normal to the process location, the paddle chamber further having a plurality of sidewall portions extending downwardly away from the process location to the base portion, and wherein the base portion includes a first surface facing toward the process location and a second surface facing opposite from the first surface, and wherein the second surface is inclined to have a higher elevation toward a perimeter of the process location than toward a center of the process location; and
- a paddle device disposed in the paddle chamber, the paddle device having at least one paddle extending for a second distance generally parallel to the first axis, the second distance being at least 30% of the first distance, and wherein at least one of the workpiece support and the at least one paddle is movable along a generally linear second axis to agitate processing fluid at the process location while the workpiece support carries a microfeature workpiece.

39. A system for processing microfeature workpieces, comprising:
- a vessel configured to receive a processing fluid, the vessel having a generally planar process location positioned to receive a microfeature workpiece;
- a workpiece support positioned to releasably carry a microfeature workpiece at the process location of the vessel; and
- a paddle device having at least one paddle, at least one of the workpiece support and the at least one paddle being movable relative to the other along a generally linear motion axis, the at least one paddle having a first surface, a second surface facing opposite from the first surface, and a plurality of highly flow-restrictive apertures extending through the at least one paddle from the first surface to the second surface, the at least one paddle being at least partially transmissive to the processing fluid to allow the processing fluid to pass through the at least one paddle as a result of relative motion between the at least one paddle and the workpiece support.

* * * * *